(12) United States Patent
Barthelmes et al.

(10) Patent No.: US 8,491,713 B2
(45) Date of Patent: Jul. 23, 2013

(54) SOLUTION AND PROCESS FOR INCREASING THE SOLDERABILITY AND CORROSION RESISTANCE OF A METAL OR METAL ALLOY SURFACE

(75) Inventors: Jürgen Barthelmes, Berlin (DE); Robert Ruether, Oranienburg OT Lehnitz (DE); Olaf Kurtz, Berlin (DE); Jana Breitfelder, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 181 days.

(21) Appl. No.: 13/143,222

(22) PCT Filed: Jan. 13, 2010

(86) PCT No.: PCT/EP2010/050360
§ 371 (c)(1),
(2), (4) Date: Jul. 5, 2011

(87) PCT Pub. No.: WO2010/081833
PCT Pub. Date: Jul. 22, 2010

(65) Prior Publication Data
US 2011/0281124 A1 Nov. 17, 2011

(30) Foreign Application Priority Data
Jan. 14, 2009 (EP) .................................... 09075021

(51) Int. Cl.
| | | |
|---|---|---|
| *C23F 11/167* | (2006.01) | |
| *C23C 22/74* | (2006.01) | |
| *C23C 22/58* | (2006.01) | |
| *C23C 22/06* | (2006.01) | |
| *H05K 3/28* | (2006.01) | |
| *C25D 5/48* | (2006.01) | |

(52) U.S. Cl.
USPC ........ 106/14.12; 148/253; 148/269; 148/281; 252/389.2; 252/389.23; 252/389.24; 427/304; 427/331; 427/384; 428/457; 428/472.3

(58) Field of Classification Search
USPC ..... 106/14.12; 148/253, 269, 281; 252/389.2, 252/389.23, 389.24; 427/304, 331, 384; 428/457, 472.3
See application file for complete search history.

(56) References Cited

U.S. PATENT DOCUMENTS

| | | | |
|---|---|---|---|
| 8,337,606 B2 * | 12/2012 | Kuhlkamp | ................. 106/14.12 |
| 2003/0186914 A1 | 10/2003 | Hofer et al. | |
| 2005/0268991 A1 | 12/2005 | Fan et al. | |
| 2005/0277562 A1 | 12/2005 | Xia et al. | |
| 2007/0042122 A1 | 2/2007 | Orihashi | |
| 2008/0108537 A1 | 5/2008 | Rees | |
| 2010/0196727 A1 | 8/2010 | Kuhlkamp | |

FOREIGN PATENT DOCUMENTS

| | | |
|---|---|---|
| FR | 2858821 | 2/2005 |
| WO | 2005085498 | 9/2005 |
| WO | 2007008369 | 1/2007 |
| WO | WO 2009007122 A1 * | 1/2009 |

OTHER PUBLICATIONS

J.S.McNatt et al.; "Sonication Assisted Growth of Fluorophosphate Films on Alumina Surfaces"; American Chemical Society, Langmuir 2003, Jan. 25, 2003, pp. 1148-1153, XP-002591641.
DuPont: "DuPont Zonyl UR Fluorosurfactant"; Jun. 1, 2002, XP-002591642.
Hirsch; "Tin, Lead, and Tin-Lead Plating" Metal Finishing, vol. 104, 2006, pp. 266-277.
PCT/EP2010/050360; PCT International Search Report and Written Opinion of the International Searching Authority dated Jul. 14, 2010.

* cited by examiner

*Primary Examiner* — Anthony J Green
(74) *Attorney, Agent, or Firm* — Renner, Otto, Boisselle & Sklar, LLP

(57) ABSTRACT

Described is a new a solution comprising a phosphorous compound and optionally a solderability-enhancing compound and its use in a process for increasing the solderability and corrosion resistance of a metal or metal alloy surface.

18 Claims, 5 Drawing Sheets

SOLUTION AND PROCESS FOR INCREASING THE SOLDERABILITY AND CORROSION RESISTANCE OF A METAL OR METAL ALLOY SURFACE

FIELD OF THE DISCLOSURE

The invention relates to a solution comprising a phosphorous compound and optionally a solderability-enhancing compound and its use in a process for increasing the solderability and corrosion resistance of a metal or metal alloy surface.

BACKGROUND OF THE INVENTION

Metal coatings, particularly of tin or its alloys are frequently deposited onto surfaces of copper- and nickel-based workpieces in order to prevent the copper or nickel-based surface from oxidizing or tarnishing and to enhance solderability.

Under conditions such as elevated temperatures in air or in other oxidizing atmospheres, for example tin or other metal-coated surfaces of electronic lead frames and electrical connectors have a tendency to form oxide films during periods of shipment and storage between manufacture and assembly into electronic devices. The oxide coats discolor the surface of the tin-coated surface and impart a yellowish color which many consumers consider unacceptable. Furthermore, the oxide may degrade the contact resistance of a coated electrical terminal. A tarnish-free surface has lower electrical contact resistance and better solderability than an oxide coated surface.

Tin-based layers are also used in lead finishes for integrated circuit ("IC") fabrication. A thin layer of tin or tin alloy is applied as the final step for passive components such as capacitors and transistors.

There are many factors that determine good solderability, the three most important of which are extent of surface oxide formation (corrosion), amount of co-deposited carbon, and extent of intermetallic compound formation. Surface oxide formation is a natural occurring process because it is thermodynamically favorable. The rate of formation of the surface oxide depends on the temperature and time. The higher the temperature and the longer the exposure time, the thicker the surface oxide formed. In electroplated tin or tin alloy coatings or deposits, surface oxide formation also depends on the surface morphology of the coating or deposit. When comparing pure tin to tin alloy coatings, for example, tin alloys generally form less or thinner surface oxides when all other conditions are equal.

Generally, it is the aim to produce a tarnish-free surface, which has lower electrical contact resistance and better solderability than an oxide coated surface.

Fuchs et al., in U.S. Pat. No. 5,853,797 disclose a method and solution for providing corrosion protection of coated electrical contact surfaces which involves exposure of such surfaces to a solution containing phosphonates, lubricants and various volatile organic solvents. Evaporation of such solvents for disposal is fraught with environmental concerns such as handling, hazard to workers, and disposal of waste into streams.

Fan et al., in U.S. Pat. Appl. No. 2005/0268991 A1 disclose a method for enhancing corrosion resistance of a tin-based surface on a workpiece involving contacting the tin-based surface with a composition comprising a phosphonic acid compound and water to form a phosphorus-based film over the tin-based coating thereby inhibiting corrosion of the tin-based surface. Phosphonic acid containing compositions having a concentration up to about 30 vol. % of an organic solvent, and water. However, the use of organic solvents is disadvantageous since they are volatile under process conditions and often hazardous.

Lau et al., in U.S. Pat. Appl. No. 2006/0237097 A1 disclose a method for inhibiting corrosion of metals and metal alloys by treating them with compositions containing inorganic and organic phosphoric acids like alkylphosphoric acids that prevent oxide formation on the metals and metal alloys.

EP 0 009 247 B relates to the use of alkyl monophosphonic acid containing from 8 to 10 carbon atoms in admixture with surfactants as corrosion inhibitors against metals in acid solutions. The metals are selected from the group consisting of aluminum and aluminum alloys, chromium-nickel-steel, ordinary steel, brass and copper.

EP 1 221 497 A2 relates to a method for inhibiting the formation of stains, especially water stains, on the exterior surfaces of aluminum alloy products. The method entails contacting the exterior surfaces of these products, particularly sheet or plate products, extrusions and/or forgings made from 5000 to 6000

Series aluminum alloys, with an organophosphonic or organophosphinic acid-derived material. Preferably, liquid forms of this material are added to an alcohol or water-based carrier solution, then sprayed, dipped, painted or rolled onto the surfaces of flat sheet or plate products to enhance their brightness.

GB 2 331 942 A relates to a composition comprising at least one organo phosphonate or organo phosphonate species used for the treatment of a variety of metal surfaces to inhibit corrosion and improve adherence of coatings. The composition can include a homopolymer or copolymer of an organo phosphonate or organo phosphonate species such as vinylphosphonic acid, vinylidene-1,1-diphosphonic acid or phenyl vinyl phosphonic acid.

U.S. Pat. No. 3,630,790 describes a method of protecting metal surfaces from corrosion which comprises contacting the metal with an organo phosphonic, phosphonous or phosphinic acid.

Although the above mentioned methods are all directed to treatment of metal and metal alloy surfaces in order to preserve their quality regarding solderability and appearance, there is still a need for an environmentally friendly process offering improved corrosion resistance as well as whisker suppression.

SUMMARY OF THE DISCLOSURE

The present invention relates to an aqueous solution which comprises a phosphorous compound and, optionally a solderability-enhancing compound as defined herein below.

Further, the present invention relates to a process for increasing the solderability and corrosion resistance of a metal or metal alloy surfaces wherein the surface is contacted with this aqueous solution.

DETAILED DESCRIPTION OF THE INVENTION

Figure 1:
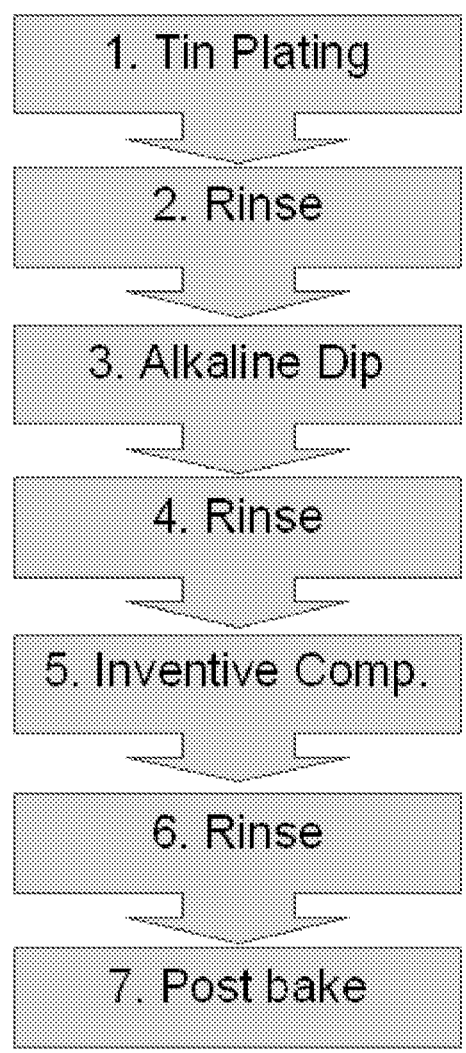
FIG. 1 shows a treatment sequence of plating and applying the composition according to the present invention.

The invention is directed to a solution and a process for enhancing corrosion resistance of metal or metal alloy surfaces e.g. of nickel, copper, silver, gold, palladium, platinum, rhodium, ruthenium, indium and alloys thereof. Preferably the metal or metal alloy surface is a tin or tin alloy surface. Examples of tin alloy surfaces comprise SnPb, SnCu, SnBi, SnAg and SnAgCu.

For purposes of illustration, one such workpiece is an electronic component such as an electronic lead frame, a passive component, a bump on a wafer or is an electrical connector. Other suitable metal surfaces comprise zinc, aluminum, iron or copper or their alloy based surfaces.

The solution according to the invention is applicable to any metal surface, preferably a tin or tin alloy surface, whether part of an electronic device, engineering, functional, decorative, or otherwise. With regard to tin-based surfaces for electronic devices, the method enhances corrosion resistance and also preserves solderability of a tin or tin alloy surface during storage prior to a soldering operation involving reflow of a portion of the tin-based surface.

The solution of the present invention is also applicable for very thin metal surfaces, e.g. gold, which possess pores. Such pores can be sealed with the solutions of the present invention and prevent the oxide formation of underlying layers of e.g. nickel, copper or tin under the gold layer.

In accordance with the invention, the metal-based surface is immersed or otherwise contacted with a composition comprising a phosphorous compound, a solderability-enhancing compound and water to form a phosphorus-based film over the tin-based surface. This film inhibits corrosion of the tin-based surface, increases wettability and solderability and surprisingly also prevents whisker formation.

The aqueous solution for treating a metal surface according to the present invention comprises (a) at least one phosphorous compound or its salt represented by the followings formulas

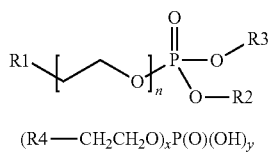

I.

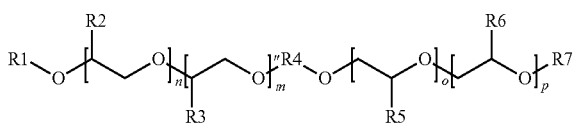

II.

$(R4—CH_2CH_2O)_xP(O)(OH)_y$ wherein R1 is selected from the group comprising H, OH, $C_1$-$C_{20}$-alkyl, substituted or unsubstituted, linear or branched, $C_1$-$C_6$-alkaryl, linear or branched, substituted or unsubstituted and aryl, substituted or unsubstituted, R2 and R3 are the same or different and are selected independently from the group consisting of H, a suitable counter ion like sodium or potassium, $C_1$-$C_{20}$-alkyl, substituted or unsubstituted, linear or branched, $C_1$-$C_6$-alkaryl, linear or branched, substituted or unsubstituted and aryl, substituted or unsubstituted, $C_1$-$C_{20}$-alkylene, substituted or unsubstituted, linear or branched and wherein n is an integer ranging from 1 to 10, preferably, R1 of the phosphorous compounds according to formula I. is selected from the group consisting of H, OH, methyl, ethyl, n-propyl, isopropyl, n-hexyl, isohexyl, n-heptyl, isoheptyl, n-octyl, isooctyl, n-nonyl, isononyl, n-decyl, isodecyl, n-undecyl, isodecyl, n-dodecyl, isododecyl, preferably, R2 and R3 of the phosphorous compounds III. are selected independently from the group consisting of H or a suitable counter ion like sodium or potassium, methyl, ethyl, n-propyl, isopropyl, n-hexyl, isohexyl, n-heptyl, isoheptyl, n-octyl, isooctyl, n-nonyl, isononyl, n-decyl, isodecyl, n-undecyl, isodecyl, n-dodecyl, isododecyl, R4 is $F(CF_2CF_2)_z$, z ranges from 1 to 7, x is 1 or 2, y is 1 or 2 and x+y is 3, and optionally (b) at least one solderability-enhancing compound or its salt represented by the following formula

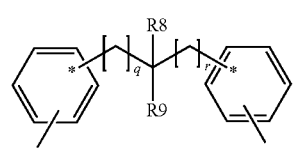

III.

wherein m, n, o and p are integers ranging from 0 to 200 and are the same or different and m+n+o+p is at least 2. Preferably m+n+o+p ranges from 4 to to 100, more preferably from 10 to 50 and wherein R1 and R7 are the same or different and are selected independently from the group consisting of H, a suitable counter ion like sodium or potassium, $C_1$-$C_{20}$-alkyl, substituted or unsubstituted, linear or branched, $C_1$-$C_6$-alkaryl, linear or branched, allyl, aryl, sulfate, phosphate, halide and sulfonate and wherein each of the R2, R3, R5 and R6 groups may be the same or different and are selected independently from the group consisting of H, $C_1$-$C_6$-alkyl, linear or branched, substituted or unsubstituted and wherein R4 is selected from the group consisting of $C_1$-$C_{12}$-alkylene, linear or branched, substituted or unsubstituted, arylene 1,2-, 1,3- and 1,4-substituted, naphthylene, 1,3-, 1,4- 1,5- 1,6- and 1,8-substituted, higher annulated arylene, cycloalkylene, —O—$(CH_2(CH_2)_nOR1$, wherein R1 has the meaning defined above, and moieties represented by the following formulas

IV.

wherein the substitution independently is 1,2-, 1,3- or 1,4 for each ring and wherein q and r are the same or different and range independently from 0 to 10 and R8 and R9 are selected independently from the group consisting of H and $C_1$-$C_6$-alkyl, linear or branched.

Substituted alkyl, alkaryl and aryl groups described herein are hydrocarbyl moieties which are substituted with at least one atom other than carbon and hydrogen, including moieties in which a carbon chain atom is substituted with a hetero atom such as nitrogen, oxygen, silicon, phosphorous, boron, sulfur, or a halogen atom. The hydrocarbyl moieties may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers.

Preferred are aqueous solutions, wherein R1 and R7 of the solderability-enhancing compound III. are selected independently from the group consisting of H, methyl, sodium, potassium, halide, sulfate, phosphate and sulfonate.

Preferred are aqueous solutions, wherein R2, R3, R5 and R6 of the solderability-enhancing compound III. are selected independently from the group consisting of H, methyl, ethyl, n-propyl and isopropyl.

Preferred are aqueous solutions wherein R4 of the solderability-enhancing compound III. is selected from the group represented by the following formulas

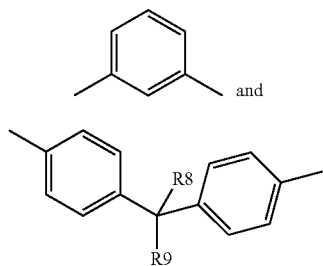

and wherein R8 and R9 are selected from the group consisting of H, methyl, ethyl, n-propyl and isopropyl.

Solderability-enhancing compounds according to formula III. having the following formulas are particularly preferred.

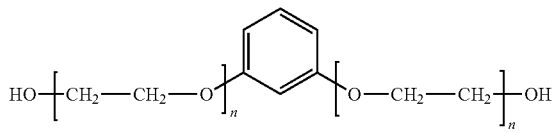

and wherein n=1-20, preferably 3-8.

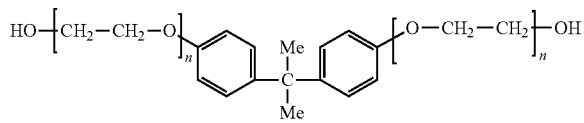

and wherein n=1-20, preferably 2-10.

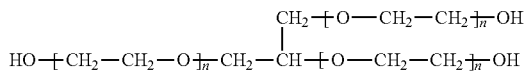

wherein n=1-20, preferably 2-7.

The aqueous compositions according to the present invention usually have a pH of 1-8, preferably of 2-5. In order to ensure a constant pH value during operation preferably a buffer system is applied to the solution. Suitable buffer systems comprise formic acid/formiate, tartaric acid/tartrate, citric acid/citrate, acetic acid/acetate and oxalic acid/oxalate. Preferably, the sodium or potassium salt of the aforementioned acid salts are used. Besides the mentioned acids and corresponding salts, all buffer systems can be applied which result in a pH value of the aqueous compositions of 1-8, preferably of 2-5.

The buffer concentration is in the range of 5-200 g/l for the acid and of 1-200 g/l for its corresponding salt.

The at least one phosphor compound a) represented by the formulas I. and II. of the aqueous solutions is preferably used in an amount of 0.0001 to 0.05 mol/l, more preferably 0.001 to 0.01 mol/l.

The optional at least one solderability-enhancing compound (b) represented by the formula III. is generally used in an amount of 0.0001 to 0.1 mol/l, preferably 0.001 to 0.005 mol/l.

Optionally, the solution may additionally contain at least one water soluble organic solvent selected from the group comprising $C_2$-$C_6$ alcohols, $C_2$-$C_6$ glycols and esters thereof. The concentration of said organic solvent ranges from 0.001 ml/l to 100 ml/l, more preferred from 0.1 ml/l to 20 ml.

Optionally, the solution may additionally contain an anti-foaming agent which is commercially available.

The aqueous compositions according to the present invention are usually applied during a process sequence as shown in FIG. 1.

Plating preferably with tin or a tin alloy is by standard methods known in the art and for example described in Metal Finishing, Guidebook & Directory, 2006, p. 266-277. Generally, metal plating can be both by electrolytic as well as electroless plating methods.

Tin or tin alloy plating is preferred, but also zinc, aluminium, iron or copper plating may be employed.

For example, a typical tin plating bath may include one or more water soluble tin salts such as tin sulfate, tin alkyl sulfonates such as tin sulfonate, tin alkanol sulfonic acid, and tin halides such as tin chloride and tin fluoroborate. The bath also includes electrolytes such as sulfuric acid, alkyl sulfonates, alkanol sulfonates and halide salts to provide an electro-conductive matrix. Surfactants also may be included as well as other conventional additives to provide a desirable tin layer. The amounts of the components are conventional and are well known in the art and may be obtained from the literature.

The numbers in the following paragraphs refer to the treatment sequence as shown in FIG. 1.

The plating step 1. often is in an acidic plating bath followed by a rinse step 2. with demineralised water and an optional neutralisation step 3. applying an alkaline solution in case the plating bath is acidic and vice versa. Optionally, the plated surface is again rinsed with demineralised water and then treated in step 5. with a solution according to the present invention.

Preferably, the substrate is immersed into the solution. Alternatively, spraying or dipping is also possible.

The treatment time can vary between 1 s and 10 minutes, preferably the contact time is at least 5 s and does not exceed 60 s. Generally, the solutions are at temperatures of 15° C. to 60° C., preferably from 20° C. to 40° C.

The metals and metal alloys may then be optionally rinsed with water to remove any excess oxide inhibiting composition.

A post bake step may follow the treatment and rinse step by heating the substrate to a temperature between 100 and 200° C. and a time of 30 and 120 minutes. This step is particularly preferred if the substrate is a lead frame. The post baking further reduces the whisker formation.

A reflow process may follow the treatment and rinse step. Any suitable reflow process may be used. Reflow may be by heating by vapour phase reflow, laser reflow, plasma, oven melting, and passing an electrical current through the metals and metal alloys, or by any other method of heating the metals and metal alloys above their melting temperature.

The present invention is further illustrated by the following examples.

General: The substrate to be plated is a copper sheet.

The copper surface is plated with tin using a commercially available tin plating bath (Stannopure® HSM-HT, Atotech Deutschland GmbH) consisting of tin methanesulfonic acid (70 g/l tin), 200 g/l methanesulfonic acid, wetting agent and grain refiner. The bath temperature is 40° C., the current density 10 A/dm$^2$, the plating time 2.0 min and the coat thickness (Sn) 10 μm.

Example 1

Comparative

A copper sheet as described before is plated with tin according to above mentioned Stannopure® HSM-HT process.

After plating the copper sheet is treated according to the process sequence as shown in FIG. 1 and described above, except that step 5 (treatment with a solution according to the present invention) is omitted.

The alkaline dip (step 4) is carried out in a solution containing 10 g/l potassium phosphate, $K_3PO_4$, at room temperature for 15 s. Post baking is at 150° C. for 1 hour.

Figure 2:
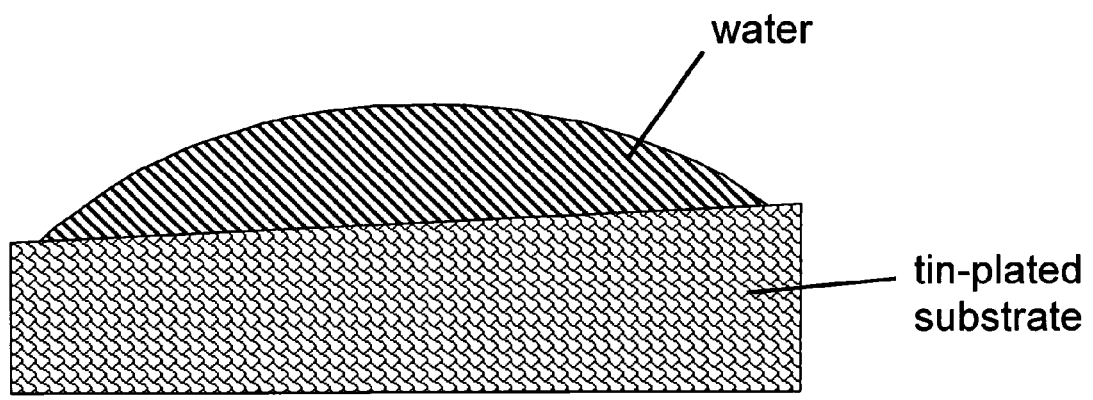
FIG. 2 shows the water dissemination on an untreated tin-plated sample without any post-treatment derived from comparative example 1.

The dissemination of water on the tin-plated substrate surface having a contact angle of 35° against water is shown in FIG. 2.

Example 2

A copper sheet as described before is plated with tin according to above mentioned Stannopure® HSM-HT process.

The alkaline dip (step 4, FIG. 1) is carried out in a solution containing 10 g/l potassium phosphate, $K_3PO_4$, at room temperature for 15 s. The inventive composition according to step 5 of FIG. 1 is an aqueous solution containing 1 g/l of a compound according to formula I. wherein n=2, R1=methyl, R2=a cis-9-octadecenyl residue and R3=H.

Post baking is at 150° C. for 1 hour.

Figure 3:
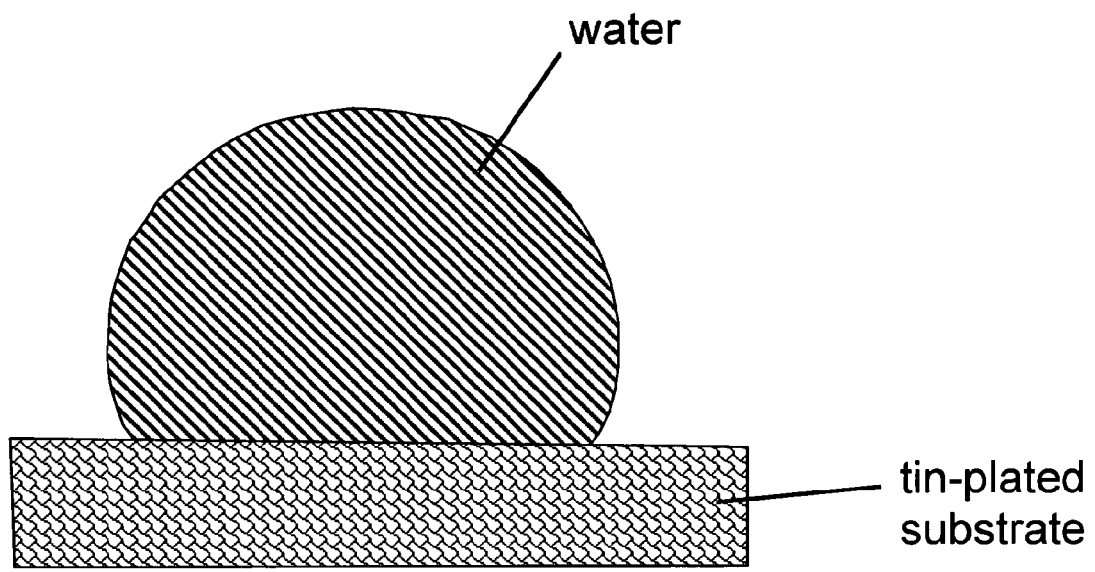
FIG. 3 shows the water repelling effect of a tin-plated sample treated with a composition according to example 2.

The water repellent effect of a solution according to example 2 is shown in FIG. 3. The contact angle of water on a tin-plated substrate treated with a solution according to example 2 without application of step 3 (FIG. 1) is 113° and when applying step 3 the contact angle against water is 111°.

Example 3

A copper sheet as described before is plated with tin according to above mentioned Stannopure® HSM-HT process.

The alkaline dip (step 4, FIG. 1) is carried out in a solution containing 10 g/l potassium phosphate, $K_3PO_4$, at room temperature for 15 s. The inventive composition according to step 5 of FIG. 1 is an aqueous solution containing 1 g/l of a 1 g/l of a compound according to formula I. wherein n=2, R1=methyl, R2=a cis-9-octadecenyl residue and R3=H, 10 ml/l isopropylglycol and 10 g/l α,α',α"-1,2,3,-Propanetriyl-tris[ω-hydroxypoly(oxy-1,2-ethandiyl)], CAS No. 31694-55-0

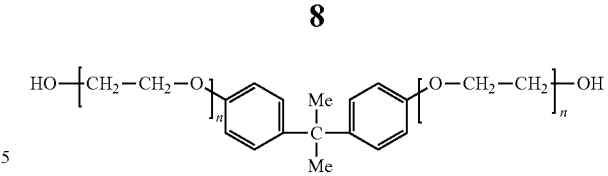

Post baking is at 150° C. for 1 hour.

Figure 4:
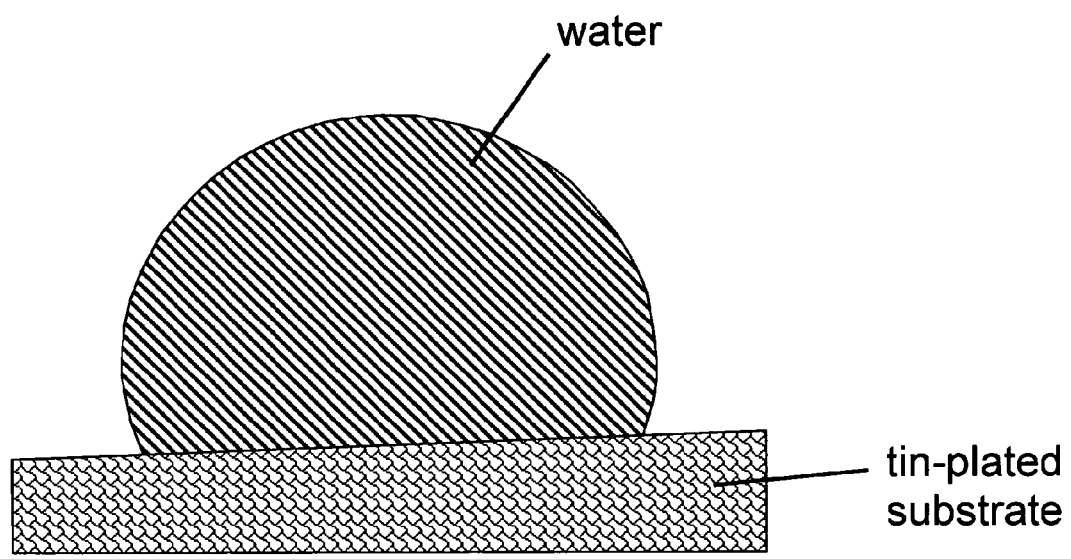
FIG. 4 shows the water repelling effect of a tin-plated sample treated with a composition according to example 3.

The water repellent effect of a solution according to example 3 is shown in FIG. 4. The contact angle of water on a tin-plated substrate treated with a solution according to example 3 without application of step 3 (FIG. 1) is 119° and when applying step 3 the contact angle against water is 114°.

Example 4

A copper sheet as described before is plated with tin according to above mentioned Stannopure® HSM-HT process.

The alkaline dip (step 4, FIG. 1) is carried out in a solution containing 10 g/l potassium phosphate, $K_3PO_4$, at room temperature for 15 s. The inventive composition according to step 5 of FIG. 1 is an aqueous solution containing 1 g/l of a compound according to formula II. (Zonyl® UR, DuPont), 10 ml/l isopropylglycol and 10 g/l α,α',α"-1,2,3,-Propanetriyl-tris[o-hydroxypoly(oxy-1,2-ethandiyl)], CAS No. 31694-55-0

Post baking is at 150° C. for 1 hour.

Figure 5:
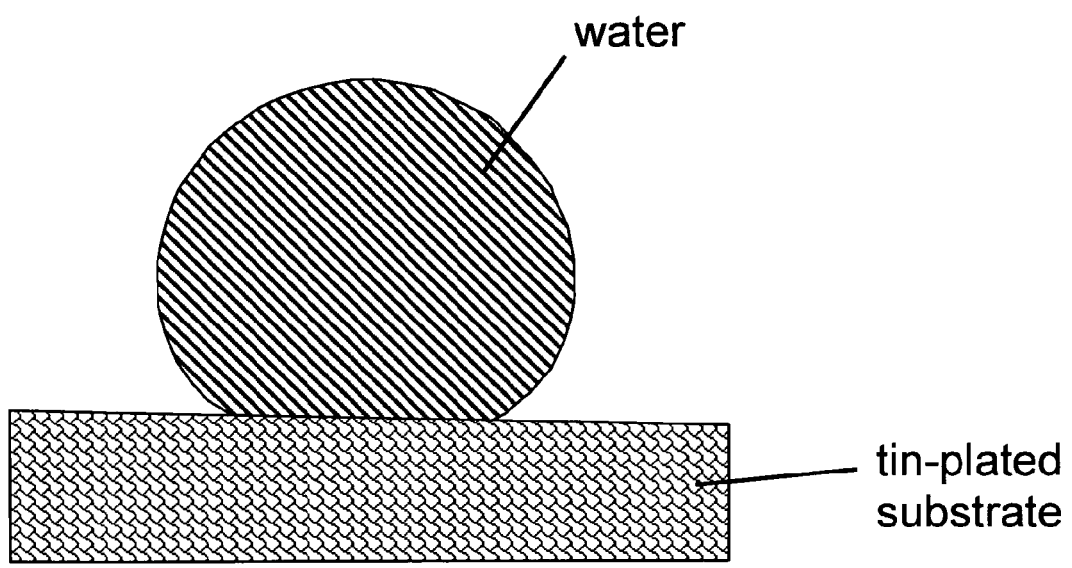
FIG. 5 shows the water repelling effect of a tin-plated sample treated with a composition according to example 4.

The water repellent effect of a solution according to example 4 is shown in FIG. 5. The contact angle of water on a tin-plated substrate treated with a solution according to example 4 without application of step 3 (FIG. 1) is 136° and when applying step 3 the contact angle against water is 142°.

From the results the effect on solderability by the treatment with compositions of the present invention becomes apparent. Compared to the prior art it also becomes apparent that the compounds can be used in concentrations much lower than described. WO 2005/121405 A1 according to Example 1 disclosed the use of 10 g/l n-octylphosphonic acid instead of 1 g/l in case of the present invention.

Additionally, the discoloration of samples prepared according to Examples 1-4 was observed. After 4.000 hours at 55° C. and 85% humidity, the tin-plated copper sheet treated according to Example 1 show yellow discoloration, while the tin-plated copper sheets of Examples 2-4 retain the silver colour of the freshly plated tin surface.

FIG. 3 shows the water repellent effect of a solution according to Example 2 on a lead frame compared to an untreated sample (Example 1, FIG. 2). The contact angle theta of water on freshly plated matt tin deposits, non treated and treated with the composition according to the present invention had been determined by prop Shape Analysis (DSA) with a Krüss DSA10 Mk2. The contact angle for the tin-plated copper sheets treated according to examples 2 to 4 (FIGS. 3 to 5) of larger than 110° indicate excellent water repellent properties. In contrast, the tin-plated copper sheet of Example 1 (FIG. 2) shows a not desired good wettability (the contact angle against water is 35°).

The invention claimed is:

1. An aqueous solution having a pH in the range of 1 to 5 for treating a tin or tin alloy surface comprising
   (a) at least one phosphorous compound or its salt represented by the following formulas I or II:

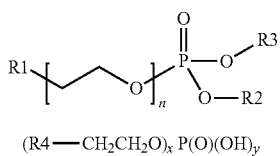

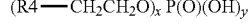

wherein R1 is selected from the group consisting of H, OH, methyl, ethyl, n-propyl, isopropyl, n-hexyl, isohexyl, n-heptyl, isoheptyl, n-octly, isooctyl, n-nonyl, isononyl, n-decyl, isodecyl, n-undecyl, isodecyl, n-dodecyl, isododecyl, R2 and R3 are the same or different and are selected independently from the group consisting of H, a counter ion, $C_1$-$C_{20}$-alkyl, substituted or unsubstituted, linear or branched, $C_1$-$C_6$-alkaryl, linear or branched, substituted or unsubstituted and aryl, substituted or unsubstituted and wherein n is an integer ranging from 2 to 10,
R4 is $F(CF_2CF_2)_z$, z ranges from 1 to 7, x is 1 or 2, y is 1 or 2 and x+y is 3 and
   (b) at least one solderability-enhancing compound or its salt represented by the following formula

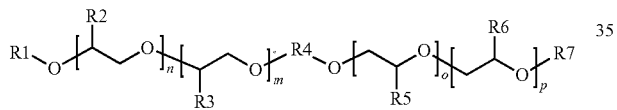

wherein m, n, o and p are integers ranging from 0 to 200 and are the same or different and m+n+o+p is at least 2
wherein R1 and R7 are the same or different and are selected independently from the group consisting of H, a counter ion, $C_1$-$C_{20}$-alkyl, substituted or unsubstituted, linear or branched, $C_1$-$C_6$-alkaryl, linear or branched, allyl, aryl, sulfate, phosphate, halide and sulfonate and wherein each of the R2, R3, R5 and R6 groups may be the same or different and are selected independently from the group consisting of H and $C_1$-$C_6$-alkyl, linear or branched, substituted or unsubstituted and wherein R4 is selected from the group consisting of $C_1$-$C_{12}$-alkylene, linear or branched, substituted or unsubstituted, arylene 1,2-, 1,3- and 1,4-substituted, naphthylene, 1,3-, 1,4- 1,5- 1,6- and 1,8-substituted, higher annulated arylene, cylcloalkylene, —O—$(CH_2(CH_2)_n$OR1, wherein R1 has the meaning defined above, and moieties represented by the following formula

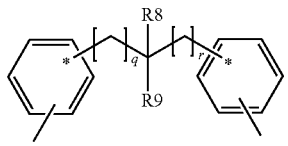

wherein the substitution independently is 1,2-, 1,3- or 1,4 for each ring and wherein q and r are the same or different and range independently from 0 to 10 and R8 and R9 are selected independently from the group consisting of H and $C_1$-$C_6$-alkyl, linear or branched.

2. An aqueous solution according to claim 1, wherein R2 and R3 of the phosphorous compound are selected independently from the group consisting of H, a counter ion, methyl, ethyl, n-propyl, isopropyl, n-hexyl, isohexyl, n-heptyl, isoheptyl, n-octyl, isooctyl, n-nonyl, isononyl, n-decyl, isodecyl, n-undecyl, isodecyl, n-dodecyl, and isododecyl.

3. An aqueous solution according to claim 1, wherein R1 and R7 of the solderability-enhancing compound III are selected independently from the group consisting of H, methyl, sodium, potassium, halide, sulfate, phosphate and sulfonate.

4. An aqueous solution according to claim 1, wherein R2, R3, R5 and R6 of the solderability-enhancing compound III are selected independently from the group consisting of H, methyl, ethyl, n-propyl and isopropyl.

5. An aqueous solution according to claim 1, wherein R4 of the solderability-enhancing compound III is selected from the following formulas

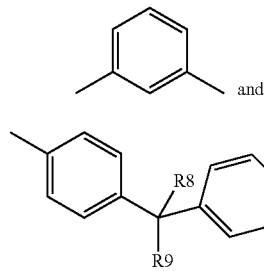

and wherein R8 and R9 are selected from the group consisting of H, methyl, ethyl, n-propyl and isopropyl.

6. An aqueous solution according to claim 1, wherein the solderability-enhancing compound III is selected from the group consisting of the following formulas

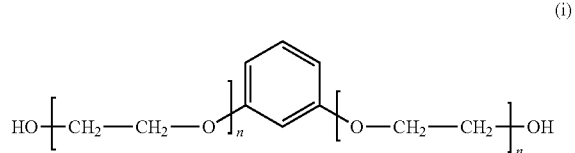

wherein n=1-20,

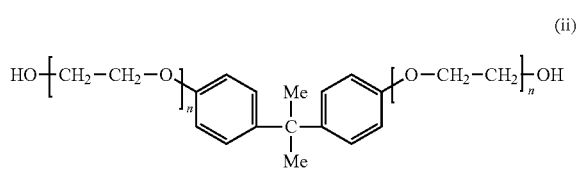

wherein n=1-20 and

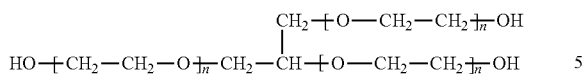

(iii)

wherein n=1-20.

7. An aqueous solution according to claim 1, wherein the at least one phosphorous compound (a) represented by the formulas I-II is used in an amount of 0.0001 to 0.05 mol/l.

8. An aqueous solution according to claim 1, wherein the at least one solderability-enhancing compound (b) represented by the formula III. is used in an amount of 0.0001 to 0.1 mol/l.

9. An aqueous solution according to claim 1, wherein the pH value is between 2 and 5.

10. An aqueous solution according to claim 1, wherein a buffer system selected from the group consisting of formic acid/formate, tartaric acid/tartrate, citric acid/citrate, acetic acid/acetate and oxalic acid/oxalate is contained.

11. An aqueous solution according to claim 1, wherein
R1 and R7 of the solderability-enhancing compound III are selected independently from the group consisting of H, methyl, sodium, potassium, halide, sulfate, phosphate and sulfonate; and
R2, R3, R5 and R6 of the solderability-enhancing compound III are selected independently from the group consisting of H, methyl, ethyl, n-propyl and isopropyl.

12. An aqueous solution according to claim 1, wherein
R1 and R7 of the solderability-enhancing compound III are selected independently from the group consisting of H, methyl, sodium, potassium, halide, sulfate, phosphate and sulfonate;
R2, R3, R5 and R6 of the solderability-enhancing compound III are selected independently from the group consisting of H, methyl, ethyl, n-propyl and isopropyl; and R4 of the solderability-enhancing compound III is selected from the following formulas

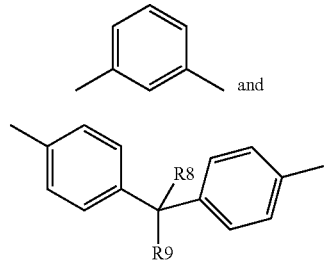

and wherein R8 and R9 are selected from the group consisting of H, methyl, ethyl, n-propyl and isopropyl.

13. A process for increasing the solderability and corrosion resistance of a substrate having a tin or tin alloy surface wherein the surface is treated with an aqueous solution according to claim 1.

14. The process according to claim 13, wherein the tin alloy surface is selected from the group consisting of SnPb, SnCu, SnBi, SnAg and SnAgCu surfaces.

15. The process according to claim 13 further comprising reflowing the tin or tin alloy surface of the substrate prior or after treatment with the aqueous solution.

16. Substrate having a tin or tin alloy surface treated with the aqueous solution according to claim 1.

17. Substrate according to claim 16, wherein the substrate is a tin plated semi-finished good.

18. Substrate according to claim 17, wherein the substrate is a tin plate or tin wire or a lead frame, a connector or a printed circuit board.

* * * * *

UNITED STATES PATENT AND TRADEMARK OFFICE
CERTIFICATE OF CORRECTION

Page 1 of 1

PATENT NO. : 8,491,713 B2
APPLICATION NO. : 13/143222
DATED : July 23, 2013
INVENTOR(S) : Barthelmes et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b)(3) by 181 days.

Signed and Sealed this
Thirty-first Day of May, 2016

Michelle K. Lee
*Director of the United States Patent and Trademark Office*